United States Patent [19]
Boyette, Jr. et al.

[11] Patent Number: 5,757,159
[45] Date of Patent: May 26, 1998

[54] HEIGHT STAGE FOR POSITIONING APPARATUS

[75] Inventors: James Edward Boyette, Jr., Delray Beach; Robert Edward Brown, Boca Raton, both of Fla.

[73] Assignee: International Business Machines Corporation, Armonk, N.Y.

[21] Appl. No.: 728,657

[22] Filed: Oct. 10, 1996

[51] Int. Cl.$^6$ .................................. B64C 17/06
[52] U.S. Cl. ...................... 318/649; 318/560; 82/11; 324/758; 324/537
[58] Field of Search ........................ 318/649, 560; 82/11; 324/758, 537

[56] References Cited

U.S. PATENT DOCUMENTS

| | | | |
|---|---|---|---|
| 4,210,038 | 7/1980 | Hill | 82/11 |
| 5,467,020 | 11/1995 | Boyetter, Jr. et al. | 324/537 |
| 5,543,726 | 8/1996 | Boyetter, Jr. et al. | 324/758 |

*Primary Examiner*—Karen Masih
*Attorney, Agent, or Firm*—Ronald V. Davidge; Richard A. Tomlin

[57] ABSTRACT

An actuator providing Z-direction movement within a positioning system extends between an input stage and an output stage. A nut is mounted to rotate on the input stage in threaded engagement with a screw extending into the nut from the output stage. The nut is driven by a motor also mounted on the input stage. A plate attached to the output stage through a flexible leaf spring slides along the input stage in the Z-direction with movement of the output stage, preventing rotation of the output stage about the axis of the screw. Lateral positioning of the screw results from the threaded engagement of the screw and nut. The leaf spring is formed to provide a lateral pre-load force between the screw and nut.

19 Claims, 1 Drawing Sheet

HEIGHT STAGE FOR POSITIONING APPARATUS

GOVERNMENT RIGHTS

This invention was made with Government support under Agreement No. MDA972-94-3-0035 awarded by ARPA. The Government has certain rights in the invention.

BACKGROUND OF THE INVENTION

Field of the Invention

This invention relates to a linear actuator having unusually high stiffness, and, more particularly, to a stiff and powerful height stage providing Z-direction movement in a positioning system including X- and Y-direction stages.

Background Information

Positioning systems are used to move various devices through predetermined motions at relatively high speeds. For example, a positioning system may be used to position one or more probes to make contact with various points of an electronic circuit board for circuit testing. Alternately, positioning systems are used in assembly operations, such as supplying components to circuit boards being assembled and moving wirebonding apparatus into place. A number of mechanisms are used to provide movements within a plane, generally referred to as X- and Y-direction direction movements within positioning systems. This plane is, for example, the plane of a circuit board undergoing testing with one or more moving probes. Movement is also required in the Z-direction, perpendicular to this plane, for example, to bring a probe out of contact with a circuit card so that it can be moved to a next test point. Since the height of a probe or other device above the circuit board is being controlled, the Z-direction stage is often called a height stage. While much less total movement is generally needed in the Z-direction than in the X- and Y-directions, such Z-direction movement needs to be rapid and precise.

Leadscrews are used to provide controlled movements of devices being positioned within various types of apparatus. However, a conventional application of this sort includes a leadscrew mounted to turn within a pair of bearings, a pair of shafts on which the device to be positioned moves with sliding bushings, and a nut attached to the device and engaged by the leadscrew. With both the rotational axis of the leadscrew and the translational path of the device being positioned being tightly held, by bearings and bushings, respectively, substantial clearance is required between the external threads of the leadscrew and the internal threads of the nut to prevent binding. However, such clearance results in a backlash condition allowing, for example, rapid movement through a clearance distance between the leadscrew and the nut to occur whenever the load force applied from the device being positioned changes direction. Furthermore, the use of bearings and bushings requires the leadscrew mechanism to be quite long, even in applications requiring relatively little overall movement. For example, a leadscrew mechanism generating only half an inch of movement is typically over two inches long.

In many applications within positioning systems, there is a great need for stiffness between the device being positioned and the framework of the system under conditions of rapid movement, making the backlash conditions resulting from the use of a conventional leadscrew mechanism intolerable. Furthermore, in a Z-direction stage moved by the X- and Y-direction stages, there is a particular need for low mass, small size, and for a mechanism having input and output portions in close proximity.

Description of the Prior Art

U.S. Pat. No. 5,543,726 describes an open frame gantry probing system which has a pair of X- and Y-direction stages movable on each side of a circuit board being tested. U.S. Pat. No. 5,467,020 describes a fixture which may be incorporated into this type of probing system to facilitate the testing of circuits on flexible substrates.

In the apparatus of U.S. Pat. No. 5,543,726, an electromagnetic actuator is used to provide Z-direction probe movement. This actuator includes a coiled wire extending around a permanent magnet formed as a central post of an assembly carrying the probe. To move the probe, electrical current is driven through the coiled wire. This patent also describes a macro-Z drive function provided with a motor moving a cam to compensate for differences in the thicknesses of circuit boards tested within the apparatus.

While this combination of a stationary coil and a moving permanent magnet core works very well for light loading, such as that provided by moving a simple electrical probe, as described in these U.S. Patents, other applications of positioning devices require much greater loads, generally because of the greater mass of the device being moved in the Z-direction. For such applications, a different type of drive is needed, having a high mechanical advantage, so that greater forces can be developed, and a much greater stiffness. Such a drive should be capable of providing both the functions of probe movement and of the macro-Z drive.

SUMMARY OF THE INVENTION

In accordance with one aspect of the invention, there is provided an actuator for providing controlled relative motion in a first direction between first and second stages. The actuator includes a first threaded part mounted to rotate on the first stage, a second threaded part, attached to the second stage, engaging the first threaded part, a drive mechanism rotating the first threaded part, and a flexible retarding mechanism preventing rotation of the second threaded part about an axis parallel to the first direction.

DETAILED DESCRIPTION

Figure 1:
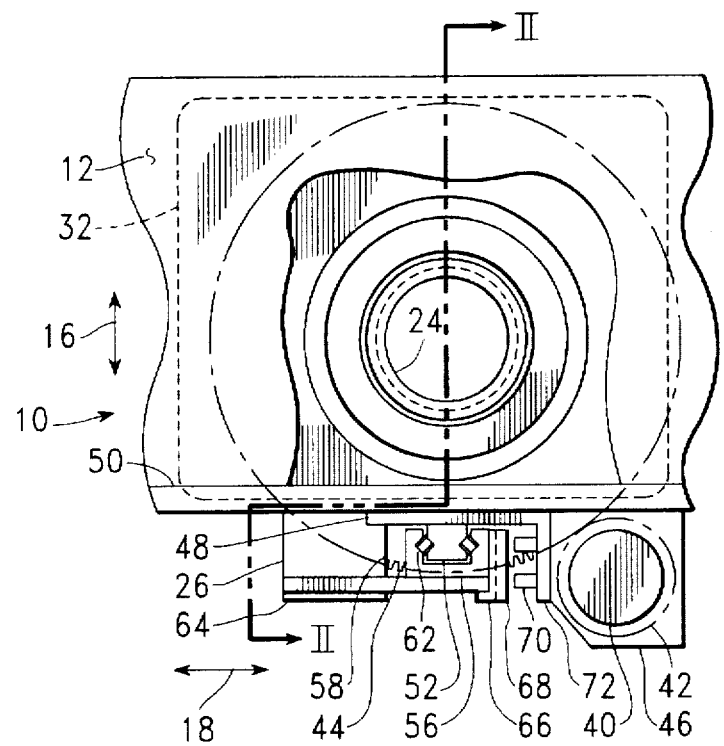
FIG. 1 is a plan view of an actuator built in accordance with the present invention as a height stage in a positioning system.
Figure 2:
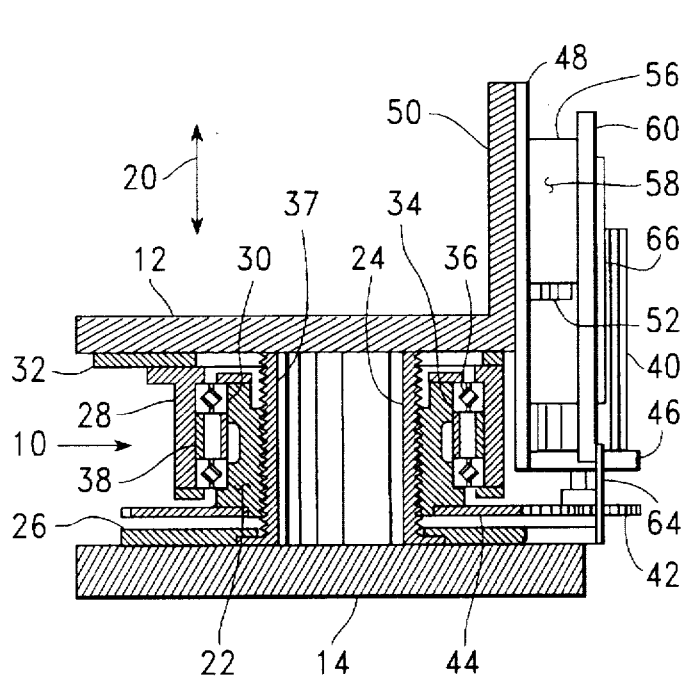
FIG. 2 is a vertical cross-sectional view of the actuator of FIG. 1, taken as indicated by section lines II—II in FIG. 1.

FIGS. 1 and 2 show an actuator 10 built in accordance with the present invention as a height stage in a positioning system, with FIG. 1 being a plan view thereof, and with FIG. 2 being a vertical cross-sectional view thereof, taken as indicated by section lines II—II in FIG. 1.

Referring simultaneously to FIGS. 1 and 2, the actuator 10 extends generally between an input stage 12 and an output stage 14. In this context, the input stage 12 provides a reference frame to which the actuator is attached. For example, the input stage 12 may be attached to the carriage of an X-Y positioning system of the type described in U.S. Pat. No. 5,543,726 providing movement within a plane, in the directions indicated by arrows 16, 18. In this example, the output stage 14 represents a load driven in the X-directions of arrow 16 and the Y-directions of arrow 18 by the mechanism (not shown) driving input plate 12, through the actuator 10, and in the Z-directions of arrow 20 by movement occurring within the actuator 10.

Figure 3:
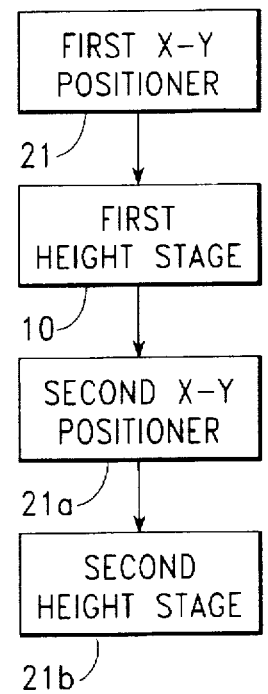
FIG. 3 is a block diagram of a positioning system using the actuator of FIG. 1.

FIG. 3 is a block diagram of a positioning system including a height stage (or actuator) 10 built in accordance with the present invention.

Referring to FIGS. 1, 2, and 3, in the example of FIG. 3, a first X-Y positioner 21 moves the actuator 10 in the X and Y directions of arrows 16, 18. The actuator 10 adds movement in the Z-direction, which is added to a resultant movement provided as an input to a second X-Y positioner 21a. The output of the second X-Y positioner 21a is provided as an input to a second height stage 21b, to which a probe (not shown) is attached. The first X-Y positioner is operated to provide relatively long movements in the directions of arrows 16, 18, which are brought about relatively slowly by the movement of input stage 12 by a first X-Y positioning system. Relatively short movements in the directions of arrows 16, 18 are brought about relatively quickly by the movement of a second X-Y positioning system 21a descending from the output stage 14. In this type of system, the stiffness and power of the actuator 10 are particularly important because of the relatively high mass of a second X-Y positioning system. On the other hand, the second height stage 21b can be relatively light in construction, since the probe it must move is light.

When such a system is used to position a probe inspecting a circuit board, long movements, from one section of the board to another, are made using the first X-Y positioning system attached to input stage 12, while short movements, within a single section of the board, are made using the second X-Y positioning system descending from output plate 14. Since inspection processes of this kind can be arranged to provide many more short movements than long movements, a strategy of this type can significantly reduce the time taken for the total inspection process.

In this application, the second height stage 21b produces all movements necessary to bring the probe (not shown) into and out of contact with the circuit board (also not shown). The actuator 10 produces movements in the Z-direction of arrow 20 to compensate for differences in circuit board thickness and to provide the clearance necessary to load and unload circuit boards from the inspection tool.

Continuing to refer to FIGS. 1 and 2, in the actuator 10, movement between output plate 14 and input plate 12 is accomplished by turning a drive nut 22 in engagement with a drive screw 24. The drive screw 24 is fastened to output stage 14 by means of a lower mounting plate 26, and drive nut 22 is rotatably mounted within a housing 28 by means of a bearing assembly 30. The housing 28 is fastened to input stage 12 through an upper mounting plate 32. The bearing assembly 30 includes a pair of bearings 34, each of which has crossed rollers 36, separated by a pair of spacers 38. Bearings of this kind employ an array of rollers rolling between alternating sides of V-grooves to carry high loads with minimal friction.

The drive screw 24 is hollow, having an internal hole 37, to reduce the overall mass of the actuator 10. The screw 24 is preferably composed of a Type 416 stainless steel, and the nut 22 is preferably composed of phosphor bronze. Neither of these materials requires plating, which could cause galling at the threaded interface. Both of these materials are easily machined to obtain a smooth surface finish, and both of these materials are hard, minimizing wear. Since these materials are dissimilar, galling is further minimized, and the inherent lubricity of phosphor bronze reduces friction.

The mechanical power to turn drive nut 22 is provided by a motor 40, which rotates a drive gear 42 meshing with a driven gear 44 attached to the nut 22. The diametral ratio between the gears 42, 45 provides a mechanical advantage of about 5.0, reducing the torque required to turn the drive nut 22. The motor 40 is mounted within actuator 10 through a ledge 46 extending as part of a vertical mounting bracket 48, which is in turn attached to an upstanding leg portion 50 of the input stage 12. An internal race 52 of a linear bearing assembly 56 is also attached to vertical mounting bracket 48. The external race 58 of this bearing assembly 56 is attached to a sliding plate 60 which is thereby allowed to move in the Z-directions of arrow 20. This bearing assembly 56 employs a pair of arrays of crossed rollers 62 rolling between alternating sides of V-grooves. Sliding plate 60 is attached to lower plate 26 through a flexible leaf spring 64.

Thus, the X-Y positioning of output stage 14, in the directions of arrows 16, 18, together with the angular positioning of output plate 14 about a first axis parallel to arrow 16 and about a second axis parallel to arrow 18 are determined by the engagement conditions between drive nut 22 and drive screw 24. To assure accurate positioning, drive nut 22 and drive screw 24 have a large diameter, a fine pitch, and a tightly-controlled class of fit. Satisfactory results have been achieved using a two-inch pitch diameter, a pitch of forty threads per inch, and a running clearance of 0.0005 inch, with an engagement length of 1.25 inches between the screw and the nut.

On the other hand, the rotation of output stage 14 about a vertical axis parallel to the directions of arrow 20 is prevented by a retarding torque placed on lower mounting plate 26 by the linear bearing assembly 56 through sliding plate 60 and leaf spring 64. While the flexibility of leaf spring 64 allows the rotation of nut 22 without binding under simultaneous conditions of tight clearances between nut 22 and screw 24 and within the linear bearing assembly 56, a pre-determined deflection within the leaf spring 64 may be used to apply a lateral preloading, in one of the directions of arrow 16, between screw 24 and nut 22. This type of lateral loading removes clearances, and hence backlash, remaining between the screw 24 and nut 22 even under conditions of tight clearances therebetween.

The sliding plate 60 also has attached thereto a flag bracket 66 including a block-shaped flag portions 68 extending toward proximity sensors 70 mounted on a tab 72 extending outward from vertical mounting bracket 48. The flag portions 68 and the proximity sensors 70 are preferably arranged so that a first of these sensors 70 produces a first output signal as the drive screw 24 approaches the upper end of its allowable travel, so that a second proximity sensor 70 produces a second output signal as the drive screw 24 approaches the lower end of its allowable travel, and so that a third proximity sensor produces an output as the drive screw 24 approaches a home position. Also, the drive motor 40 preferably includes an encoder emitter producing pulses with its rotation.

Thus, during operation of the actuator 10, the position of the drive screw 24, and hence the vertical position of output stage 14, is tracked by counting the encoder or emitter pulses indicating the revolutions turned by the rotor of motor 40. When the drive screw 24 is returned to a home position, as indicated by a signal from the third proximity sensor 70, the count of pulses is reset. Depending on the application, the drive screw 24 may be returned to the home position after every operation or on a periodic basis. The home position may be near one of the ends of allowable motion of the drive screw, or close to the center of such motion. In any case, motion is stopped when the output of the first or second proximity sensor 70 indicates that an allowable travel limit is being approached, and the drive screw 24 is preferably returned to the home position.

While leaf spring 64 is very flexible in its direction of flexure it is very stiff in extension or compression in the directions of arrow 20. Thus, the movement of sliding plate 60 closely tracks the movement of output stage 14, allowing accurate measurements of the vertical position of stage 14 to be made using the movement of flag portions 68 attached to the plate 60.

Thus, a height stage formed according to the present invention has substantial capabilities for moving a relatively heavy mass, due to the mechanical advantage provided by the drive ratio of gears 42, 44, and by the use of the helical screw principle to convert rotary motion to linear motion. Significant advantages are gained over the use of a conventional leadscrew, in that very tight clearances can be achieved between the drive nut 22 and the drive screw 24 without binding. Even these tight clearances are removed by lateral pre-loading through the leaf spring 64.

While the invention has been described in its preferred form or embodiment with some degree of particularity, it is understood that this description has been given only by way of example and that numerous changes in the details of construction, fabrication and use, including the combination and arrangement of parts, may be made without departing from the spirit and scope of the invention.

What is claimed is:

1. An actuator for providing controlled relative motion in a first direction between a first stage and a second stage, wherein said actuator comprises:

a first threaded member/rotatably mounted on said first stage;

a second threaded member, attached to said second stage, engaging said first threaded member;

drive means for rotating said first threaded member; and flexible retarding means preventing rotation of said second threaded member about an axis parallel to said first direction.

2. The actuator of claim 1, wherein said drive means includes:

a motor attached to said first stage turning a drive gear; and a driven gear attached to said first threaded member engaging said drive gear.

3. The actuator of claim 1, wherein said flexible retarding means includes a sliding plate slidably attached to said first stage, to move in said first direction thereon; and a flexible connection between said sliding plate and said second stage.

4. The actuator of claim 3, wherein said flexible connection includes a leaf spring extending in a plane parallel to said first direction.

5. The actuator of claim 3, additionally comprising a plurality of sensing devices actuated by movement of said sliding plate to provide indications of a position of said second stage.

6. The actuator of claim 1, wherein positioning of said second threaded member along a plane perpendicular to said first direction is controlled by engagement of threaded surfaces of said first and second threaded members.

7. The actuator of claim 6:

wherein said flexible retarding means includes a sliding plate slidably attached to said first stage, to move in said first direction thereon, and a flexible connection between said sliding plate and said second stage; and wherein said flexible connection applies a pre-loading force to said second member in a direction perpendicular to said first direction.

8. The actuator of claim 1, wherein said first threaded member is a nut and said second threaded member is a screw.

9. The actuator of claim 8, wherein said nut and said screw have a pitch diameter of two inches, a pitch of forty threads per inch, and a running clearance of 0.0005 inch.

10. A positioning system comprising:

a first positioner moving a first stage in a plane perpendicular to a first direction; and an actuator moving a second stage in said first direction relative to said first stage, wherein said actuator includes a first threaded member rotatably mounted on said first stage, a second threaded member, attached to said second stage, engaging said first threaded member, drive means for rotating said first threaded member, and flexible retarding means preventing rotation of said second threaded member about an axis parallel to said first direction.

11. The positioning system of claim 10, comprising in addition a second positioner attached to said second stage, moving a probe in said plane perpendicular to said first direction.

12. The positioning system of claim 11, wherein said drive means includes:

a motor attached to said first stage turning a drive gear; and a driven gear attached to said first threaded member engaging said drive gear.

13. The positioning system of claim 11, wherein said flexible retarding means includes a sliding plate slidably attached to said first stage, to move in said first direction thereon; and a flexible connection between said sliding plate and said second stage.

14. The positioning system of claim 13, wherein said flexible connection includes a leaf spring extending in a plane parallel to said first direction.

15. The positioning system of claim 13, additionally comprising a plurality of sensing devices actuated by movement of said sliding plate to provide indications of a position of said second stage.

16. The positioning system of claim 11, wherein positioning of said second threaded member along a plane perpendicular to said first direction is controlled by engagement of threaded surfaces of said first and second threaded members.

17. The positioning system of claim 16:

wherein said flexible retarding means includes a sliding plate slidably attached to said first stage, to move in said first direction thereon, and a flexible connection between said sliding plate and said second stage; and wherein said flexible connection applies a pre-loading force to said second member in a direction perpendicular to said first direction.

18. The positioning system of claim 11, wherein said first threaded member is a nut and said second threaded member is a screw.

19. The positioning system of claim 18, wherein said nut and said screw have a pitch diameter of two inches, a pitch of forty threads per inch, and a running clearance of 0.0005 inch.

* * * * *